United States Patent [19]

Mercer

[11] Patent Number: 4,625,310

[45] Date of Patent: Nov. 25, 1986

[54] UNIVERSALLY TESTABLE LOGIC ELEMENTS AND METHOD FOR STRUCTURAL TESTING OF LOGIC CIRCUITS FORMED OF SUCH LOGIC ELEMENTS

[76] Inventor: M. Ray Mercer, 3024 Thousand Oaks Dr., Austin, Tex. 78746

[21] Appl. No.: 602,830

[22] Filed: Apr. 23, 1984

[51] Int. Cl.$^4$ ............................................. G01R 31/28
[52] U.S. Cl. ..................................... 371/15; 307/445; 324/73 R; 371/25
[58] Field of Search ................. 371/15, 25; 324/73 R, 324/73 AT, 73 PC; 307/445, 465, 468

[56] References Cited

U.S. PATENT DOCUMENTS

| | | | |
|---|---|---|---|
| 3,761,695 | 9/1973 | Eichelberger | 371/25 |
| 3,777,129 | 12/1973 | Mehia | 371/25 |
| 4,224,048 | 1/1981 | Tsui | 371/15 |
| 4,225,957 | 9/1980 | Doty, Jr. et al. | 371/15 |
| 4,357,703 | 11/1982 | Van Brunt | 371/15 |
| 4,499,519 | 2/1985 | Still et al. | 371/15 |
| 4,542,508 | 9/1985 | Moore | 371/15 |

OTHER PUBLICATIONS

M. R. Mercer, Digital Design for Testability and Concurrent Fault Detection in LSI and VLSI Devices, The University of Texas at Austin, Aug. 1980, (Ph. D. Dissertation).
A. S. LePaugh et al., Total Stuck-at-Fault Testing by Circuit Transformation, Proc. of IEEE 20th Design Automation Conf. 1983, pp. 713–716.
Williams et al., Design for Testability-A Survey, IEEE Trans. on Computers, vol. c-31, No. 1, Jan. 1982, pp. 2–15.
S. Das Gupta et al., Dual-Mode Logic for Function-Independent Fault Testing, IEEE Trans. on Computers, Nov. 1980, pp. 1025–1029.
S. Funatsu et al., Designing Digital Circuits with Easity Testable Consideration, Proc. of IEEE Semiconductor Test Conf., Oct. 31, 1978, pp. 98–102.
P. V. Jordan, Integrated Circuit Testing, IBM Technical Disclosure Bulletin, vol. 13, No. 5, Oct. 1970, pp. 1093–1094.
T. A. Williams, Testing of LSI Logic Circuits Containing Imbedded Shift Arrays, IBM Tech. Discl. Bulletin, vol. 20, No. 10, Mar. 1978, pp. 4021–4022.
J. C. Leininger, On-Chip Testing Enhancement of a Single-Chip Microprocessor, IBM Tech. Discl. Bulletin, vol. 21, No. 1, Jun. 1978, pp. 5–6.
F. Tsui, In-System In-Isolation Module Testing Design, IBM Technical Disclosure Bulletin, vol. 25, No. 10, Mar. 1983, pp. 5124–5127.
R. Spillman, Single Stuck-Type Fault Detection in Multi-Valued Combinational Circuits, 6th Intl. Symposium on Multi-Valued Logic, pp. 97–101.
J. C. Cassani et al., Defect Diagnostic Circuit Utilizing Functional Arrays, IBM Tech. Discl. Bulletin, vol. 17, No. 12, May 1975, pp. 3539–3540.
M. T. McMahon, Jr., Noninhibited Chip-in-Place Test, IBM Technical Disclosure Bulletin, vol. 22, No. 4, Sep. 1979, pp. 1478–1479.
J. J. Gniewek, Error Correction Technique, IBM Technical Disclosure Bulletin, vol. 22, No. 5, Oct. 1979, pp. 1847–1848.

Primary Examiner—Charles E. Atkinson
Attorney, Agent, or Firm—Jerry M. Keys

[57] ABSTRACT

The design of a universally testable logic element from which combinational and sequential logic circuits can be formed is disclosed. The logic element is designed to operate as a NAND gate, NOR gate, or other functionally complete logic function in its normal mode. In a first test mode, the element functions like an OR gate. In a second test mode, the element functions like an AND gate. By building a circuit with such a logic element, the circuit can be tested for all classical stuck-at-zero and stuck-at-one faults with a minimal number of test patterns. Methods of testing both combinational and sequential circuits formed from such logic elements are also disclosed.

33 Claims, 13 Drawing Figures

UNIVERSALLY TESTABLE LOGIC ELEMENTS AND METHOD FOR STRUCTURAL TESTING OF LOGIC CIRCUITS FORMED OF SUCH LOGIC ELEMENTS

BACKGROUND OF THE INVENTION

1. Field of the Invention

The present invention relates to a design for universally testable logic elements useful in forming logic circuits and to a method for detecting faults in such logic circuits in order to do rapid testing of integrated circuits, logic boards and logic-based digital computing systems.

2. Description of the Prior Art

Very large-scale integrated circuits consist of many logic elements which are accessed by a relative small number of input/output ("I/O") pins. The manufacture testing of these devices has the objective of separating properly operating units from those which do not function properly. This task is a difficult one, and an increasing fraction of the unit device cost is required for manufacture testing.

When many integrated circuits are placed on a logic board, this assembly must also be tested. In this case, a determination is first required of whether or not the board works properly. If a malfunction is indicated, then the source of the problem must be diagnosed accurately to the "least replaceable unit" (usually one integrated circuit). When many logic boards are assembled as a logic system, occasional diagnostics are run to assure proper operation or locate failed components. At all three levels—integrated circuit, logic board, and system—rapid testing and diagnostic information is a desirable characteristic.

The testing described above involves the application of test patterns to inputs, the observation of output responses, and the comparison of these outputs with known good values. Patterns and expected responses can be generated based on the intended function (or operation) of the logic circuit, in which case the testing is described as *functional testing*. On the other hand, test patterns can be generated based upon the known design structure and expected device failure models; this type of testing is known as *structural testing*. Various combinations of functional and structural testing have been used in the logic testing art.

Because of the difficulty of determining and applying a good set of test patterns which differentiate between working and faulty logic components, numerous "design for testability" methodologies have been proposed and implemented. Each of these constrains or modifies designs so that the resulting logic circuitry is easier to test.

A summary of existing design methodologies is set out in Williams, Thomas W., and Parker, Kenneth P., "Design for Testability - A Survey," *IEEE Transactions on Computers*, Vol. C-31, January 1982, pp. 2–15. One of the most popular current methodologies discussed therein is known generically as "scan design," or "Level Sensitive Scan Design," as disclosed in U.S. Pat. No. 3,761,695. This design for testing methodology allows the test generation problem in sequential circuits to be reduced to one of generating tests for combinational logic. This is accomplished by adding shift registers to the logic design to load a test sequence (by shifting in the circuit state) and unload the circuit's signal response to such data sequence (by scanning out the circuit state). Numerous improvements to this popular design have been developed. They include U.S. Pat. Nos. 4,225,957; 4,224,048; and 4,357,703; and the following IBM Technical Disclosure Bulletins: Vol. 13, No. 51, pp. 1093–1094; Vol. 20, No. 10, pp. 4021–4022; Vol. 25, No. 10, pp. 5124–5127.

The technical literature contains a few publications on the concept of "function-independent" or "structural" digital network testing. For this class of "design for testability" methodology, a set of structural faults is postulated, and circuits are designed in such a way that the applied test set (which is usually quite small) effectively detects all such (stuck-at) faults—independent of the intended functional operation of the particular logic network. This is possible because these circuits have special "test modes" in addition to the "normal mode" of operation. A recent publication in this area is "Dual-Mode Logic for Function Independent Fault Testing" by Sumit Dasgupta, Carlos R. P. Hartmann, and Luther D. Rudolph in the *IEEE Transactions on Computers*, November 1980, pp. 1025–1029. This publication, however, discloses only a theoretical circuit which requires at least four "control" inputs in addition to the usual data inputs for detecting single stuck-at faults with at least two test patterns. The publication also sets out a theoretical proof that a sequential logic network can be constructed to detect all single stuck-at faults and data input faults with at least six test patterns but only if the network has at least five control inputs. No practical realizations of such a theoretical circuit were suggested.

A publication entitled "Total Stuck-at-Fault Testing by Circuit Transformation" by A. S. La Paugh and R. J. Lipton in the *Proceedings of the IEEE 20th Design Automation Conference*, 1983, pp. 713–716, proposes a "structural testing" approach to the production testing of VLSI which is actually the combination of three techniques which would be used independently. First, the author suggests using a special class of combinational circuits called "bipartite circuits" for designing the circuits. Bipartite circuits are circuits which have their essential parts duplicated so long as all the circuits consist solely of NOR and NAND gates. The author uses a color-coded wiring technique to test to determine if a circuit is bipartite or to convert a non-bipartite circuit into a bipartite one. Secondly, the author suggests using a NMOS controllable gate with the "bipartite" circuit. Thirdly, the author suggests adding observational logic to observe the events that will occur at the internal nodes of the circuit.

All function-independent methodologies proposed to date have been of only academic value because their complexity and the associated design overhead (silicon area consumption) renders them far from economically viable.

The first conceptual steps toward a realistic and economical, function-independent methodology are described in my Ph.D. dissertation, *Digital Design for Testability and Concurrent Fault Detection in LSI and VLSI Devices*, The University of Texas at Austin, August 1980. The dissertation describes a theoretical universally testable logic element which has the ability to detect all classical stuck-at-zero and stuck-at-one faults in arbitrary combinational circuits. Extensions of the concepts to sequential circuits are also discussed. However, the logic elements are described only functionally, and no practical realizations for the logic elements are presented or suggested. In fact, it can be shown that, using traditional logic gates, no realization of such a logic element is possible which preserves the desirable property of allowing the detection of all gate input and output stuck-at-one and zero faults.

SUMMARY OF THE INVENTION

Briefly, the present invention provides for a new universally testable logic element which can be used as the design primitive for forming any combinational or sequential logic circuit. The use of such a logic element permits the structural testing of the logic circuit for the traditional fault set—all logic gate inputs and outputs stuck-at-one and stuck-at-zero—plus all stuck-at-open and stuck-at-closed nonredundant switch faults, with a minimal number of test patterns.

The novel element includes a gate having at least two switches and data input terminals, a mode switch coupled between the data input terminals, and a mode input terminal. The logic element generates a functionally complete logic function determined by the gate function, such as a NAND function or NOR function, in its normal mode of operation. In a first test mode, the element generates the complement of the normal mode function, e.g., an OR function for a NOR gate or an AND function for a NAND gate. In a second test mode, the element generates a function determined by the wired logic of the element in response to applying a signal at the mode switch to short data input terminals. In this second test mode, the element generate a function which is the dual of the function in the first test mode; e.g., a wire logic OR function in the second test mode instead of the AND function in the first test mode.

The elements can be realized by using any type of bidirectional switch, including an MOS technology device, such as an NMOS enhancement device.

Sequential circuits can also be built and tested using such elements. It is advisable (but not required), however, that all state information in a sequential circuit be held in cross-coupled universally testable logic elements.

The novel method for testing a combinational circuit constructed from universally testable logic elements for such faults can be accomplished with two test patterns. The novel method for testing a sequential circuit constructed from such logic elements can be accomplished with four test patterns. These methods can be applied at the intergrated circuit level, logic board level or digital system level to locate faulty least replaceable units with a minimal test pattern set.

DESCRIPTION OF THE PREFERRED EMBODIMENT

The AND logic gate is extremely good at detecting stuck-at-zero faults at its inputs or outputs. In particular, if a combinational circuit is composed entirely of AND gates then all stuck-at-zero faults will be detected by just one test pattern—all primary inputs at logic one with all expected outputs at logic one. Any stuck-at-zero fault will produce at least one logic zero at a primary output with this test pattern. These facts hold regardless of the number of AND gates in the combinational circuit and the way in which they are interconnected. One condition needs to be imposed. Every gate must be controllable by some set of primary inputs and observable via at least one primary output. All proper designs satisfy these criteria.

In a similar manner, the OR logic gate is extremely good at detecting stuck-at-one faults. If a combinational circuit is composed entirely of OR gates, then all stuck-at-one faults will be detected by just one test pattern—all primary inputs at logic zero with all expected outputs at logic zero. Any stuck-at-one fault will produce at least one primary output at logic one with this test pattern—no matter how many OR gates are used or how they are interconnected.

It is well known by those skilled in the circuit design art that AND gates and OR gates are not sufficient to generate all the gate operations necessary to carry out any logic functional relationship. An inverter function NOT must be added to the AND and OR set in order to be functionally complete. In contrast, the NAND gate operation and the NOR gate operation are both functionally complete sets by themselves.

Therefore, if one logic element has a test mode where it acts like an AND gate and a second test mode where it acts like an OR gate, then a combinational logic circuit built using any arbitrary number of logic elements in any arbitrary connection arrangement can be tested for all stuck-at faults with just two test patterns. At third mode—"normal mode"—must also exist where the elements can generate all logic gate functions necessary for functional completeness.

Figure 1:
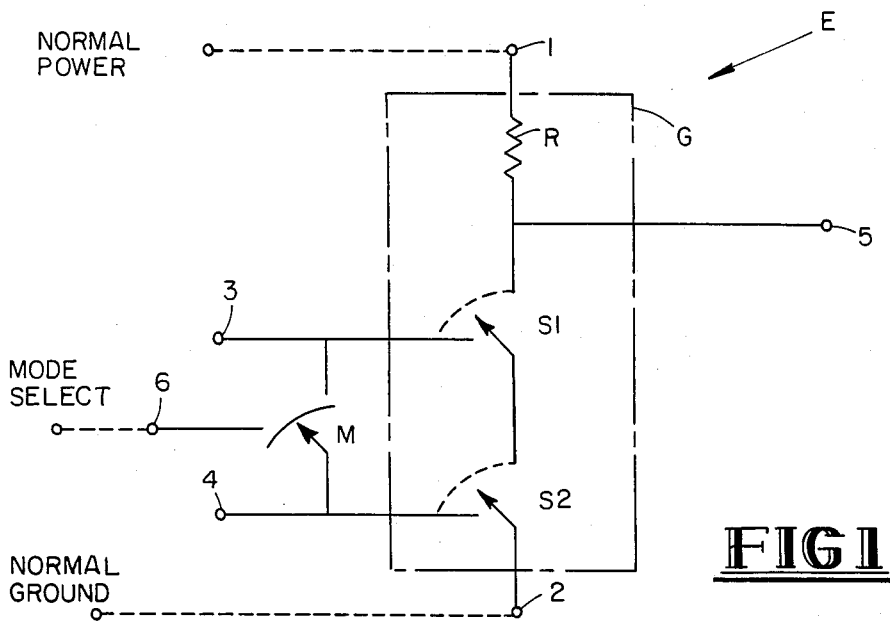
FIG. 1 is a schematic diagram of a first embodiment ("NAND") of a universally testable logic element realized with ideal switches.

In the drawings, the letter E designates generally the universally testable logic element of the present invention. FIG. 1 is a schematic diagram of a first embodiment of the universally testable logic element E wherein the element is realized with ideal bidirectional switches and a resistor. Such as element E can be used as the exclusive design primitive for constructing all of the logic functions of any combinational or sequential logic circuit C in order to facilitate the rapid structural testing of the logic circuit with a minimal number of test patterns. See FIGS. 9A and 9B.

Terminal 1 is the power terminal of the element E. This terminal 1 and all other power terminals of other elements E forming a logic circuit C are electrically coupled to a circuit primary power input called "NORMAL POWER." In a circuit's normal mode of operation, NORMAL POWER is the power input from a voltage source to the circuit, +5 volts, for example.

Terminal 1 is coupled through a resistor R to a plurality of bidirectional switches S, which are, in turn, coupled to a ground terminal 2. This ground terminal and all other ground terminals of other elements E forming a circuit C are electrically coupled to a circuit primary ground terminal called "NORMAL GROUND." In normal circuit operations, NORMAL GROUND is connected to 0 volts, for example.

Preferably, at least two switches S1 and S2 are connected in series between resistor R and ground terminal 2. Switches S1 and S2 are controlled by the logic value or signal applied at data input terminals 3 and 4, respectively. For example, switch S1 is normally open unless the input value at terminal 3 is a logic "one." For a positive logic design, a logic "one" is typically +5 volts. It should be noted that the element E can have more than two switches S and two data input terminals if more inputs are desired by the circuit designer.

A data output terminal 5 is coupled to the switch side of the resistor R and has a logic value or signal normally determined by the logic function of the gate G formed by the switches S and resistor R and the data input signals 3 and 4. In normal circuit operation, the element E of the first embodiment functions as a two-input NAND gate. Since a NAND function is a functionally complete logic function, it is possible to build any cominational logic circuit of elements E exclusively, although the number and connections between such elements E will depend on the particular circuit design.

Accordingly, data inputs 3 and 4 may come from logic circuit "Primary Data Inputs" or from the data output terminals 5 of other elements E. Each data input terminal can be driven by a "Primary Data Input" or only one output terminal of a preceding element E. Similarly, data output terminal 5 can be connected either to logic circuit "Primary Data Outputs" or to data inputs 3 or 4 of other elements E.

A mode control switch M is coupled between data input terminals 3 and 4. The position of the switch M is controlled by the logic value or signal at a mode control input terminal 6. Terminals 6 of all elements E forming a logic circuit are controlled by a circuit "Primary Control Input" at a primary input terminal called "MODE SELECT" for convenience. If MODE SELECT has the value of logic one, then all switches M in all elements E of a circuit are closed. If MODE SELECT has the value of logic zero, then all switches M in all logic elements E of the circuit are open.

Operation of Element in Combinational Circuit

Depending on the values of the three circuit primary inputs (MODE SELECT, NORMAL POWER, and NORMAL GROUND), it is evident to a logic designer of ordinary skill in the art that the logic element E of FIG. 1 will function either as an AND gate, an OR gate, or a NAND gate.

If MODE SELECT is set to logic zero, NORMAL POWER is connected to a voltage source, and NORMAL GROUND is connected to ground, then every element E in a circuit C functions as a NAND gate.

This can be seen by noting that the output can be zero only if both inputs are at a logic one so that closed switches S1 and S2 connect output terminal 5 to ground. If either terminal 3 or 4 or both terminals 3 and 4 are zero, then there is no path to ground, and the logic value at the output terminal 5 is pulled up to logic one through pullup resistor R.

If MODE SELECT is set to logic zero, then all mode control switches M are open. If NORMAL POWER is connected to *ground* and NORMAL GROUND is connected to an appropriate voltage source, then every element E functions as an AND gate.

This is true because if either the input at terminal 3 is a logic zero or the input at terminal 4 is a logic zero or both inputs are at logic zero, then there is no path to power. Output terminal 5 is pulled down to ground through "pull down" resistor R, and the logic value at element output terminal 5 is zero. If both terminals 3 and 4 are at logic one, then terminal 5 is at logic one because there is a direct path from the voltage source connected to terminal 2 to terminal 5 through closed switches S1 and S2. The above relationship between input terminals 3 and 4 and output terminal 5 exactly describes the AND logic function.

If MODE SELECT is set to logic one, then all mode control switches M are closed. If NORMAL POWER is again connected to *ground* and NORMAL GROUND is connected to the voltage source, then every element functions as an OR gate.

This can be seen by noting that if input terminals 3 and 4 are both at logic zero, then switches S1 and S2 are both open and there is no path from terminal 2 to output terminal 5. In this case, output terminal 5 is pulled down to ground through "pull down" resistor R, and the output value at terminal 5 is zero. If both inputs are at logic one, then terminal 5 is at logic one.

Figure 2:
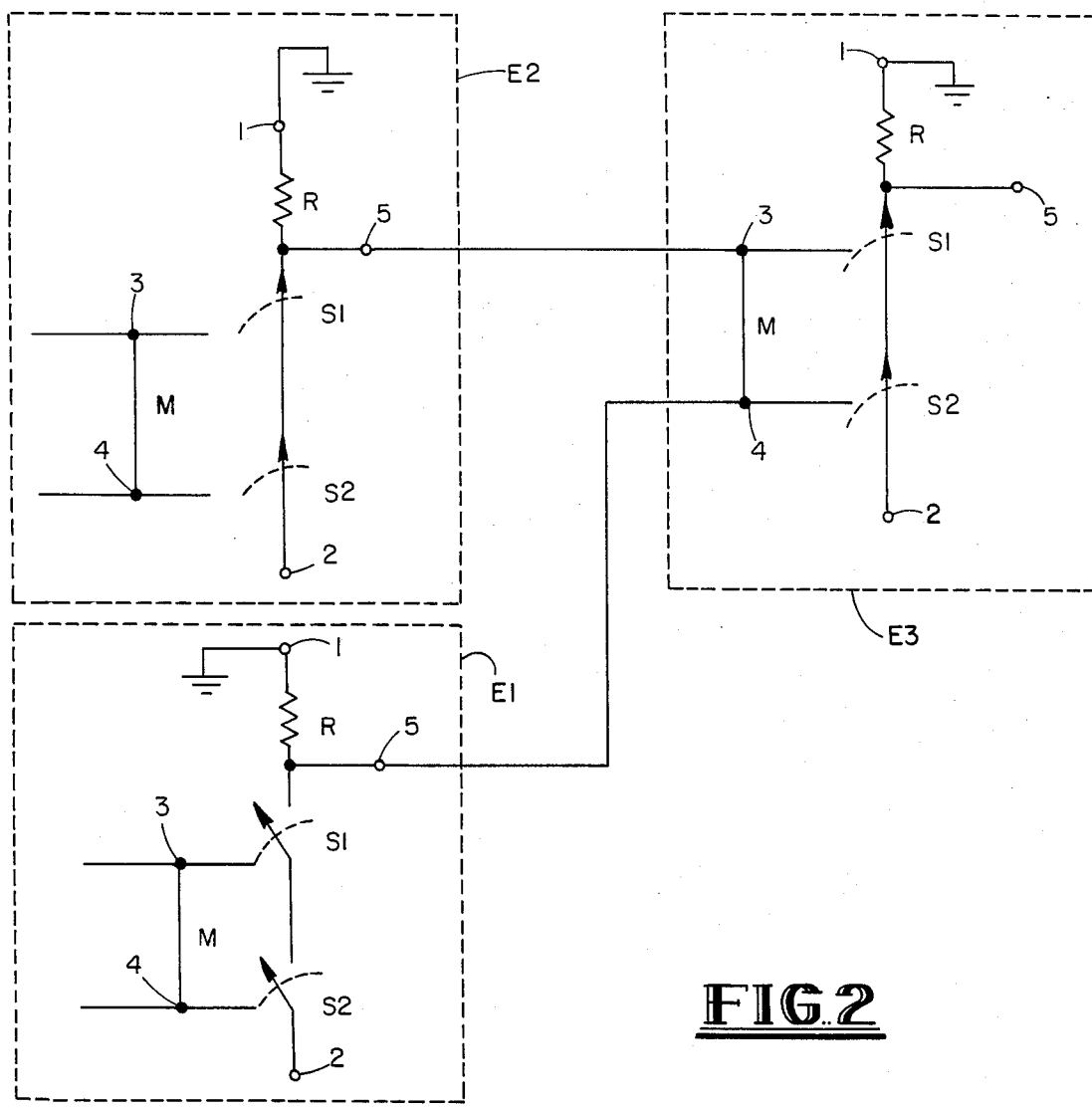
FIG. 2 is a schematic diagram of three universally testable logic elements of the first embodiment, configured to function as OR gates in a test mode.

Referring to FIG. 2, three elements E of the first embodiment are configured to function as OR gates in the second test mode in order to more fully illustrate the "wired logic" operation of the element E3 when one of the data input terminals of E3 is at logic one (from E2) and the other terminal is at logic zero (from E1).

Because the mode control terminal 6 is at logic one, switch M is closed and there is wired logic (a short) between input terminals 3 and 4, and this contention must be analyzed in order to determine which logic value will dominate. In FIG. 2, all switches M and their controls have been replaced by a short circuit for the purpose of clarity only.

Because of symmetry of the inputs, it can be arbitrarily assumed, without loss of generality, that terminal 3 of element E3 is at logic one (because it is driven by the output from terminal 5 of E2) and the logic value at terminal 4 of element E3 is pushed by the logic output from an element E1 which attempts to produce an output at its output terminal 5 of logic zero. Terminal 3 of element E3 is connected to power through switches S1 and S2 of element E2 and terminal 4 of element E3 is connected to power through switches S1 and S2 of E2 and control switch M and E3; therefore, switches S1 and S2 are both closed, and output terminal 5 of element E3 is at logic one.

In summary, output terminal 5 of E3 is at logic zero only if *both* input terminals 3 and 4 are at logic zero; otherwise, terminal 5 is at logic one. This exactly describes the OR logic function.

The logic function performed by each logic element is changed from AND and OR by changing all mode input terminal 6 inputs from logic zero to logic one. The normal function of the structure with mode switch M open is AND. Closing switch M causes the wired-OR of the two inputs and the OR function results at output terminal 5.

For the special case of an input terminal 3 or 4 connected to a primary input, the driving configuration must be such that the "wired logic" effect is "one" dominant. Otherwise, each primary input must be buffered through one or more universally testable logic elements. (A primary input should be connected to both input terminals so that 3 and 4 will always have the same logic value.)

It should be noted that in Normal Mode the NAND function is also calculated when MODE SELECT (or any individual mode control terminal 6) is set to one. Analysis shows that for this configuration, the wired logic is zero-dominant which again produces the NAND function.

In summary, since the NAND gate is a functionally complete gate, any arbitrary combinational logic function can be realized using interconnected universally testable logic elements E as shown in FIG. 1. The resulting circuit will have three modes of operation. There is one Test Mode where each element acts like an AND gate and which allows the detection of all stuck-at-zero data faults with a single test. There is a second Test Mode where each element E functions like an OR gate and which allows the detection of all stuck-at-one data faults with a single test. Finally, there is one Normal Mode where each element acts like a NAND gate and which generates the desired combinational logic function.

Figure 9A:
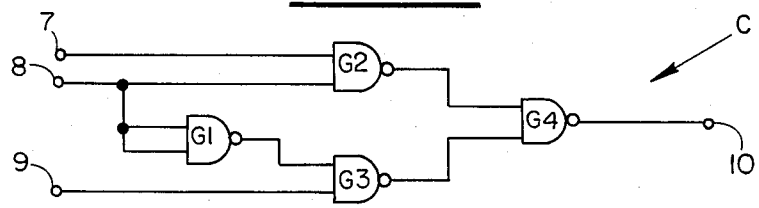
FIG. 9A is a schematic diagram of a NAND gate realization of a two-input multiplexer.
Figure 9B:
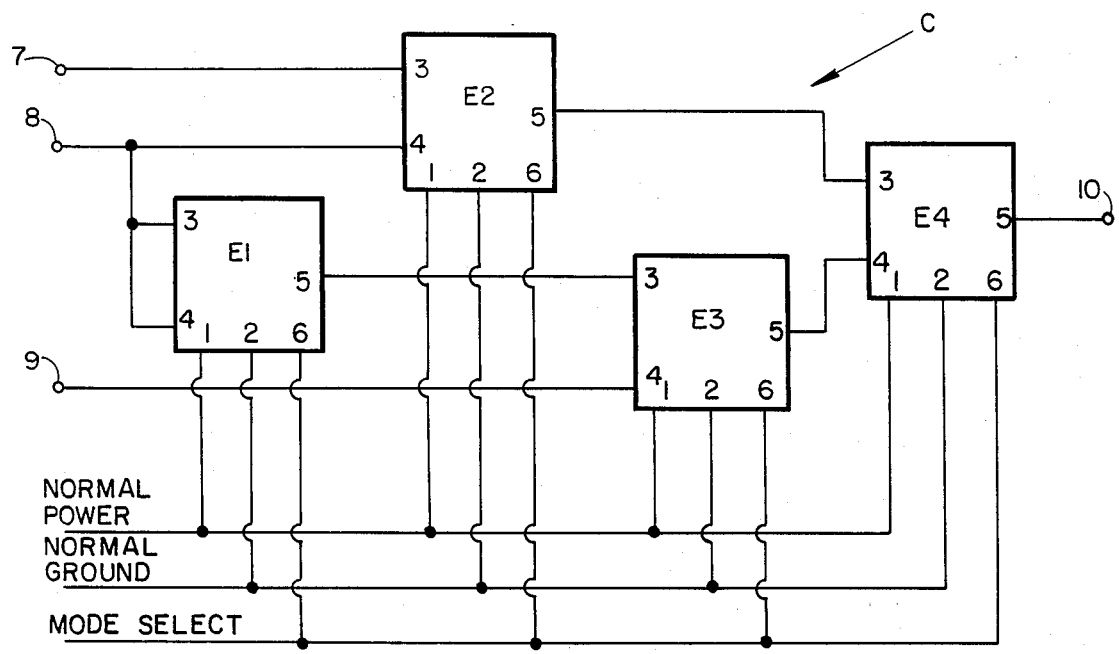
FIG. 9B is a schematic diagram of a universally testable logic element realization of the two-input multiplexer of FIG. 9A.

FIG. 9 shows an example combinational logic circuit C realization of a two-input multiplexer. FIG. 9A shows the realization using four two-input NAND gates (G1 through G4). The primary inputs are 7, 8, and 9; the single primary output is 10. If the logic value at terminal 8 is one, then the logic value of 7 is propagated to terminal 10; if the logic value at terminal 8 is zero, then the logic value at terminal 9 is propagated to 10. FIG. 9B shows the equivalent realization using four universally testable logic elements (E1, E2, E3, E4). The Normal Mode operation is identical to that of the circuit in FIG. 9A. In the AND Test Mode, all four elements perform the AND function and all stuck-at-zero data faults are detected; in the OR Test Mode, all four elements perform the OR function and all stuck-at-one data faults are detected.

Elements in Sequential Circuits

Sequential circuits can also be built using universally testable logic element E. One restriction is advisable—all state information in the circuit should be held in cross-coupled universally testable logic elements. In addition, one logic element in each pair should have its mode control input terminal 6 connected to the primary input MODE SELECT. The other logic element in each pair may have its mode control input terminal 6' connected to a new circuit primary input, MODE SELECT SEQUENTIAL. Alternatively, it may also be connected to MODE SELECT, as will be discussed in more detail below.

Figure 3A:
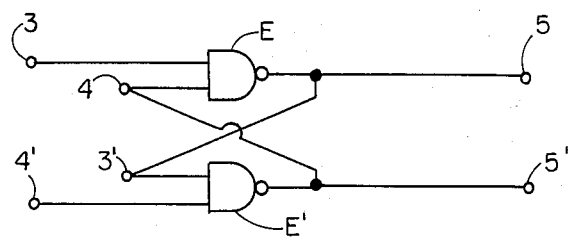
FIG. 3A is a functional logic gate representation of two cross-coupled universally testable logic elements of the first embodiment, in their normal mode of operation, for holding state information in sequential logic circuits formed from universally testable logic elements.

In normal circuit operation, both MODE SELECT and MODE SELECT SEQUENTIAL are set at logic zero. In this case, the state information is held in cross-coupled NAND gates as shown in FIG. 3A and the cross-coupled elements E operate like a S-R latch. For purposes of clarity, the "set" element E has its input and output terminals designated as 3, 4, and 5 as they are in the Element E in FIG. 1 and the "reset" element E' has its input and output terminals designed as 3', 4' and 5' respectively.

In testing a sequential circuit C where all state information is held in such cross-coupled elements E, power is again applied to the circuit NORMAL GROUND terminal and therefore all element ground terminals 2 and 2'; the circuit's NORMAL POWER terminal and therefore all element power terminals 1 and 1' are connected to a ground voltage.

In order to test for stuck-at-zero faults in a first Test Mode, a three pattern test sequence may be used. During the first test pattern, MODE SELECT, MODE SELECT SEQUENTIAL, and all other data primary inputs are set to one.

Figure 3B:
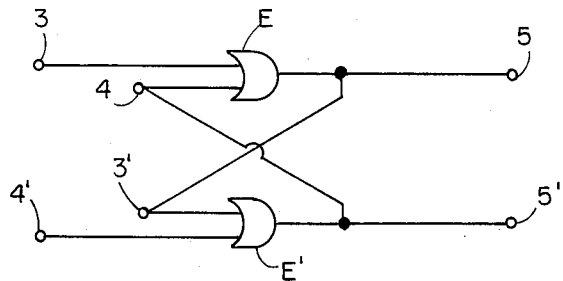
FIG. 3B is a functional logic gate representation of the cross-coupled universally testable logic elements of FIG. 3A for the first test pattern of a first test mode.

As represented in FIG. 3B, during this first test pattern all cross-coupled logic elements E act like OR gates and every non-faulty terminal of the cross-coupled elements has a logic value of one.

Figure 3C:
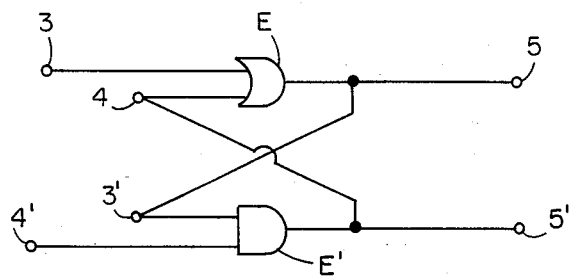
FIG. 3C is a functional logic gate representation of the cross-coupled universally testable logic elements of FIG. 3A for a transitional test pattern of a first test mode.

For the second or transitional test pattern, the MODE SELECT SEQUENTIAL terminal is set to logic zero, and as shown in FIG. 3C, the "reset" element E' of the S-R latch acts like an AND gate. However, all circuit data terminals remain at logic one, so all "reset" AND gate outputs remain at logic one.

Figure 3D:
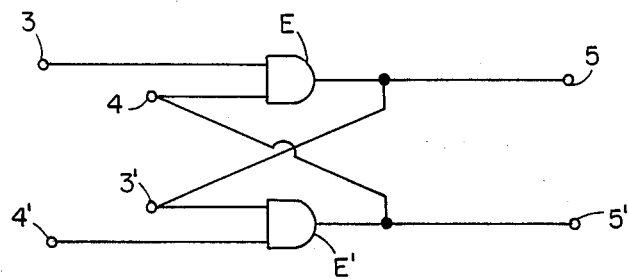
FIG. 3D is a function logic gate representation of the cross-coupled universally testable logic elements of FIG. 3A for the final test pattern of a first test mode.

For the third test pattern, the MODE SELECT terminal as well as the MODE SELECT SEQUENTIAL terminal is set to logic zero. Now all logic elements E and E' in the circuit act like AND gates. Note that all cross-coupled elements have been initialized to one as shown in FIG. 3D. Any stuck-at-zero data fault will again cause an output of zero at one or more of the primary outputs. Fault-free circuits will have all outputs and all data nodes or terminals at one.

It should be noted that the new primary input—MODE SELECT SEQUENTIAL—is not actually required, but its introduction helps to clarify the testing strategy. If only one MODE SELECT primary input is used, then only a two-pattern test sequence is required.

A similar three pattern test sequence can be used to test for all stuck-at-one data faults. In this case, all element terminals are first initilized to zero. During the first test pattern, the elements E and E' function as AND gates and then both elements E and E' are forced to act like OR gates.

Refined Universally Testable Logic Element

The logic element of FIG. 1 allows the detection of all *data faults* on logic element inputs and outputs using only two test patterns. The "AND gate" test mode also allows the detection of all data switches stuck-at-open. However, the cases of switch S1 or switch S2 stuck-at-closed are not detected and in general are not detectable with the two described test patterns. If detection of these faults is also desired, then a refinement to the universally testable logic element E is required. It should be noted that the logic designer may not believe that such additional tests are necessary for adequate manufacture testing of a particular circuit C.

Figure 4:
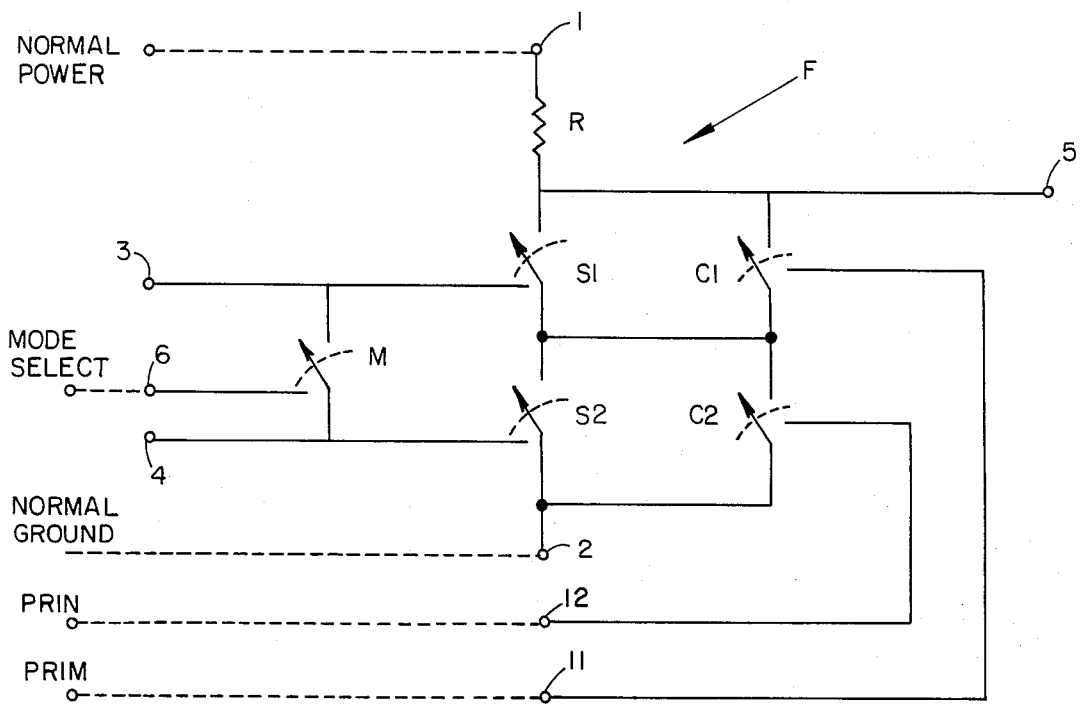
FIG. 4 is a schematic diagram of a refined version of the universally testable logic element of FIG. 1.

FIG. 4 shows a refinement F of the element E of FIG. 1. Two additional switches, C1 and C2, connected in series are coupled in parallel with switches S1 and S2. New switch C1 is controlled by the logic value or signal at a first test input terminal 11, which is in turn connected to a new circuit test input terminal called PRIM for convenience. Similarly, new switch C2 is controlled by the logic value or signal at a second test input terminal 12, which in turn is connected to a new circuit test input terminal called PRIN for convenience.

When PRIM and PRIN are both at logic zero, then this refined element F and the element E of FIG. 1 are indistinguishable. By the addition of switches C1 and C2, two useful additional test modes are possible.

In Test Mode, if MODE SELECT is set to logic one, PRIM is set to logic one, PRIN is set to logic zero, and all primary data inputs are set to zero, then all S2 and C2 switches stuck-at-closed will be detected. This can be seen by first noting that all fault-free elements not driven by a faulty element will have all data inputs as zero and in turn generate a zero data output.

In contrast, any element with switches S2 and C2 stuck-at-closed will produce a logic one at the output terminal 5 because there will be a path from power at terminal 2 through the faulty switch and switch C1 to the element output terminal 5. Finally, every refined element F which receives at least a single logic one input will produce a logic one output because the "wired logic" of this configuration is one-dominant (the OR function).

In a dual manner, if MODE SELECT is set to logic one, PRIN is set to logic one, PRIM is set to logic zero, and all data primary inputs are set to zero, then all S1 and C1 switches stuck-at-closed will be detected.

In summary, the testing strategy using refined elements F of FIG. 4 involves four test patterns for combinational logic. Two such patterns have been described in this section, and the other two were described in describing the operation of the element E of FIG. 1. This refined element F can also be used to build sequential circuits, and the required test pattern length increases by only three patterns.

By applying the test patterns set out above to the refined element F, all input and output stuck-at faults are detected. In addition, all stuck-at faults on all data switches are detected. The only stuck-at faults which remain undetected are those switch stuck-at faults on mode control switches which are functionally redundant. In particular, both stuck-at faults on M are functionally redundant because the same NAND function results independent of the state of switch M. Similarly, if switch C1 or switch C2 is stuck-at-open, this will not affect normal mode operation because these switches are always open in the normal mode.

A First NMOS Realization

Figures 5, 7:
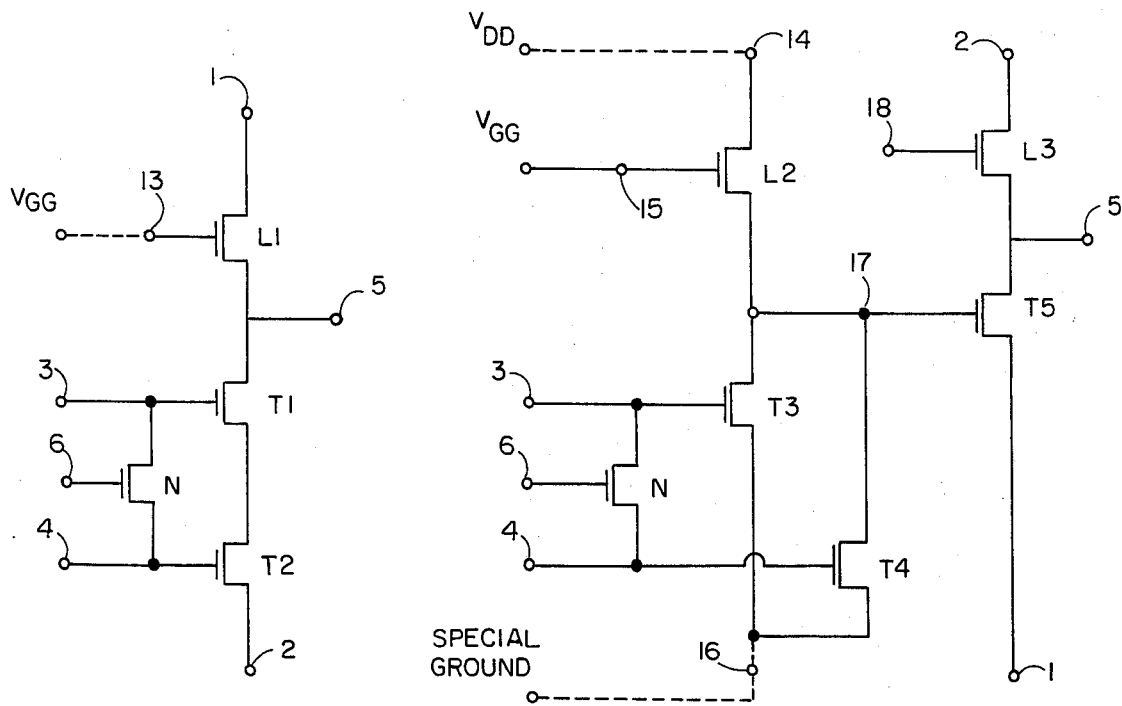
FIG. 5 is one NMOS realization of the logic element of FIG. 1.
FIG. 7 is a schematic diagram of an NMOS realization of a second embodiment ("NOR") of the universally testable logic element.

Since NMOS enhancement devices can function like bidirectional switches, the element E of FIG. 1 can be realized by using NMOS enhancement devices as shown in FIG. 5. In FIG. 5 the resistor R of FIG. 1 can be functionally replaced with an NMOS transistor L1.

The source of the N-channel transistor L1 is coupled to the power terminal 1 and the drain is coupled to the data output terminal 5. The gate of transistor L1 is coupled to a new load input terminal 13, which is in turn connected to a circuit primary voltage input $V_{GG}$, which would have the proper voltage to cause L1 to act as a load device. The value of $V_{GG}$ might not be the same in normal and test mode. The switches S1 and S2 of FIG. 1 can also be replaced by two N-channel transistors T1 and T2 in series, respectively. The source of T1 is coupled to the drain of transistor L1 and the drain of T2 is coupled to ground terminal 2. The mode switch M of FIG. 1 is also replaced by an N-channel transistor N which has its gate connected to mode terminal 6.

The substrate connection is not shown in FIG. 5, but the substrate may be connected to a circuit primary input which is distinct from both the power terminal 1 and the ground terminal 2. The voltage applied to this substrate pin will depend on the particular integrated circuit design. For example, ground or a slightly negative voltage potential could be used.

NMOS enhancement devices are not, in fact, ideal switching elements. The primary reason for this is voltage drop across the device when it is turned on. This voltage drop is usually insignificant when both the source and drain of a transistor are near logic zero (ground). On the other hand, when both source and drain are near logic one (five volts, for example), the voltage drop may be significant—on the order of the transistor threshold voltage. For this reason, conducting a logic zero through several NMOS devices connected in series is not a problem, but conducting a logic one through more than two NMOS devices in series is usually avoided under normal conditions by logic designers skilled in the art.

Figure 6:
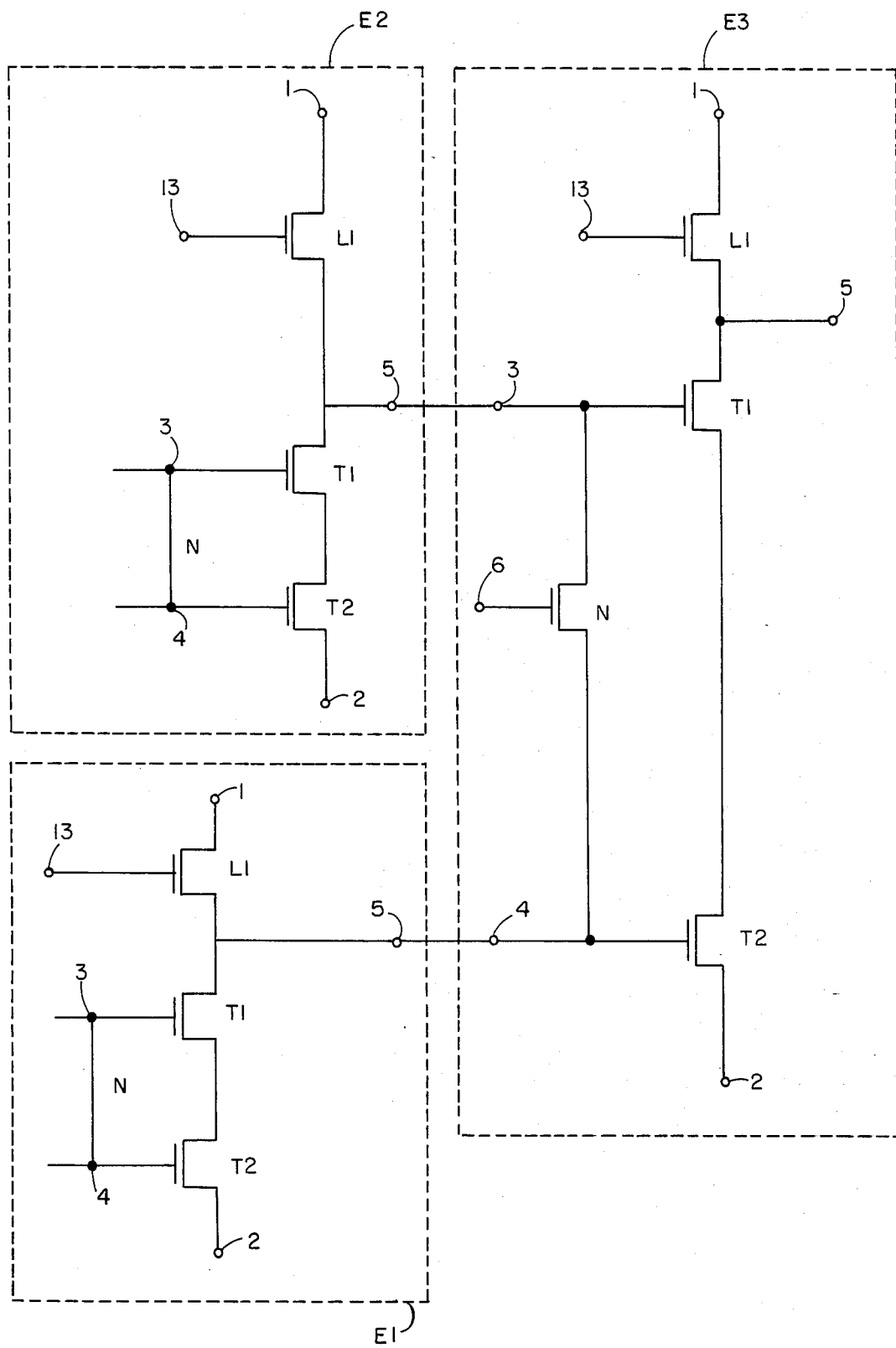
FIG. 6 is a schematic diagram of three NMOS logic elements of FIG. 5, configured to function as OR gates to illustrate the wired logic of the elements in a test mode.

In FIG. 6, three interconnected elements E in the OR Test Mode illustrates the problem of propagating a logic one through three NMOS devices for proper operation of the universally testable logic elements E. In this example, the OR test mode is being used to test for all stuck-at-one faults. Assume that somewhere, prior to element E2, a stuck-at-one fault indication has been generated and propagated as far as terminal 5 of element E2. The logic element of interest should propagate this error indication from its input terminal 3 of E3 to its output terminal 5. At the same time, no stuck-at-one fault indication exists from element E1 so that output terminal 5 of E1 is driven toward zero by enhancement load device L1. In this case, the signal which turns transistor T2 in E3 "ON" must originate at ground terminal 2 of E2 and pass through three NMOS transistors T1 and T2 in E2 and transistor N in E3. Whether or not the logic value at output terminal 5 of E3 exceeds the minimum threshold voltage for a logic one depends on a number of design, processing, and control variables. These include the detailed enhancement device characteristics (such as threshold voltage), the characteristics of the load devices (particularly L1 and E1), the substrate potential, and the applied gate voltage for load devices L1 at terminal 13.

A Second NMOS Realization

FIG. 7 shows a second NMOS realization for a universally testable logic element wherein the element E functions as a NOR gate rather than a NAND gate in its normal mode. This design resolves the switching problems discussed above with respect to NMOS devices in a series (NAND) configuration.

The design consists of two stages. In the first stage, a power input terminal 14 is coupled to a circuit primary power input called $V_{DD}$ for convenience. $V_{DD}$ would normally be coupled to the same voltage source as NORMAL POWER in the normal mode of operation.

In the test modes, terminal 14 would remain coupled to the voltage source through input $V_{DD}$ rather than coupled to ground through NORMAL POWER.

Terminal 14 is coupled to a resistance load L2. Preferably the load L2 is either an enhancement or depletion load device which has its gate coupled to a terminal 15, which, in turn, is coupled to a circuit power input, $V_{GG}$ for example. The remaining terminal of the load L2 is coupled to the sources of two N-channel transistors T3 and T4 coupled in parallel. The drains of transistors T3 and T4 are coupled to a ground terminal 16, which, in turn, is coupled to a circuit ground terminal called SPECIAL GROUND which remains connected to ground in the Test Modes. The gates of transistors T3 and T4 are coupled to the data input terminals 3 and 4 in the manner previously described for the element E of FIG. 1.

An internal data input terminal 17 is coupled to the sources of transistors T3 and T4 and normally has a logic value determined by the logic function of the first stage gate G formed by the transistors T3 and T4, the load device L2 and the data input signals at terminals 3 and 4. In normal circuit operation, the element E functions as a two-input NOR gate.

The second stage is a buffer wherein the drain of an enhancement load device L3 is connected to the ground terminal 2 and the source is connected to the drain of a single N-channel switching transistor T5. The gate of load transistor L3 is connected to a load voltage input terminal 18, which in turn is connected to $V_{GG}$. The source of transistor T5 is connected to the power terminal 1 and the gate of transistor T5 is coupled to the internal data output terminal 17 of the first stage. The data output terminal 5 is now connected to the drain of transistor T5 of the buffer stage. Thus, the normal mode element E functions as a two-input NOR gate, and any logic switching function can be built using this primitive.

In Test Modes, the second stage functions as an inverter (because ground terminal "2" is coupled to power through the circuit's NORMAL GROUND input and power terminal "1" is coupled to ground through the circuit's NORMAL POWER input). If the MODE SELECT input to terminal 6 is a logic zero, then device N is open, and the logic OR function is produced. On the other hand, if the MODE SELECT input is a logic one, then device N is conducting, and the logic AND function is produced, because the wired logic of the configuration is zero-dominant.

It should also be noted that transistors T3 and T4 conduct only a logic zero since they always have their drain connected to ground. It is never necessary that device N conduct a logic one because if terminal 3 is at logic one, then T3 is conducting and the value of terminal 4 has no effect on the element output. A similar argument holds if terminal 4 is at a logic one. Therefore, the only transistor which is required to conduct a logic one is T5, and this only occurs in Normal Mode when terminal 1 is connected to power. For this design, terminal 5 is certain to be above the required threshold voltage for a logic one if the NMOS enhancement device thresholds are properly controlled.

It should be noted that the inverter function of the second stage in Test Modes could also be accomplished by having the voltlage applied to terminals 2 and 1 remain the same in the normal and test mode and reverse the voltage applied to terminals 14 and 16 of the first stage.

Figure 8:
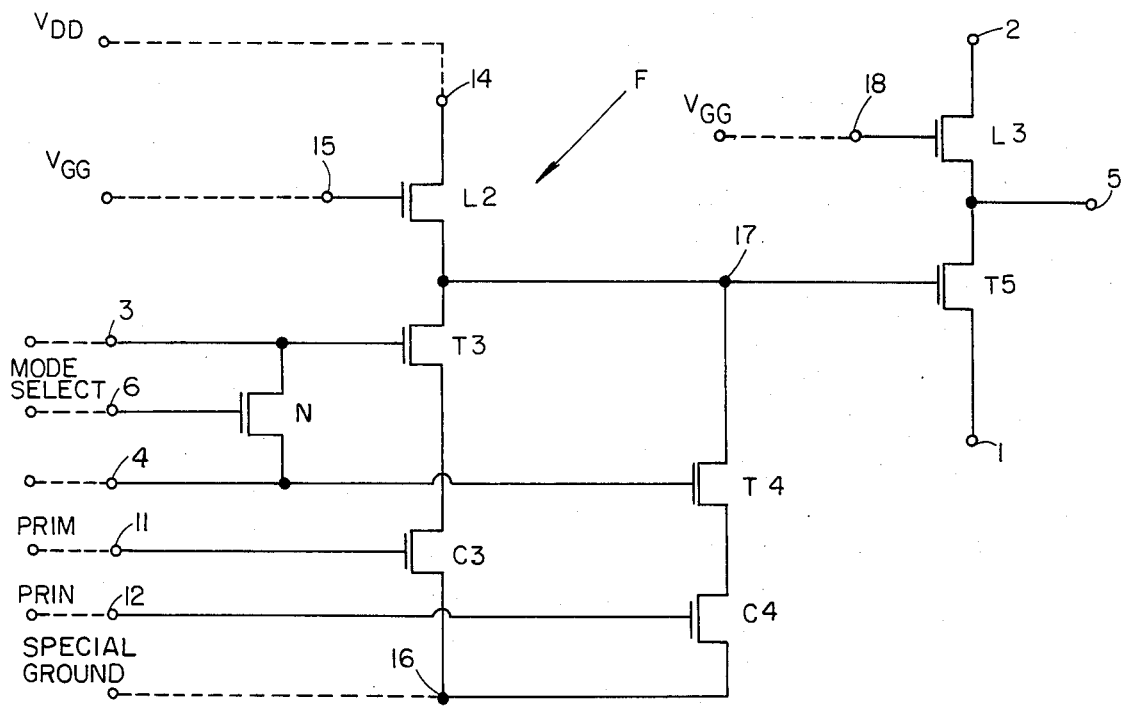
FIG. 8 is a schematic diagram of an NMOS realization of a refined version of the logic element of FIG. 7.

FIG. 8 shows an NMOS realization similar to the refined universally testable logic element F of FIG. 4 in that two additional N-channel switching transistors C3 and C4 are coupled in series with transistors T3 and T4, respectively. Transistor C3 is controlled by the logic value at terminal 11 and transistor C4 is controlled by the logic value at terminal 12.

In Normal Mode, all transistors C3 and C4 are conducting. The two additional tests discussed relative to FIG. 4 allow the detection of T4 or C4 stuck-at-open faults for one test, and T3 or C3 stuck-at-open faults for the other test. Again, the only faults not detected are C3 stuck-at-closed, C4 stuck-at-closed, and N stuck-at-open or closed. Each of these faults is again functionally redundant in the Normal Mode.

AREAS OF APPLICATION

The various embodiments and realizations of those embodiments of the universally testable logic element previously described can be used at all levels of a logic design. For LSI and VLSI devices, any logic function can be realized by interconnecting multiple copies of the universally testable logic element. For example, gate array devices could use this element as the design primitive. Structural testing using a small number of patterns will detect all classical stuck-at-faults. The testing is so simple that a sophisticated integrated circuit tester is not required to perform the tests. Such an approach allows very economical screening of manufactured chips prior to detailed functional testing. The expense and time required to either automatically or manually generate structural tests is also eliminated. These benefits are gained at the expense of some increase in silicon area and a requirement for three (or five) additional input-output pins—MODE SELECT, the substrate connection, $V_{GG}$, (and optionally PRIM and PRIN).

If all the devices on a logic board are constructed using the universally testable logic element concept, then structural board testing with a minimal number of test patterns is also possible. Thus, there are advantages to building MSI and SSI circuits using the same concept. Identification of failed devices using this testing strategy is simple since all the data values in a good board are identical. Locating the source of a faulty data value becomes a trivial task.

The concept can be applied at the system level. Because the testing is so simple, field testing and diagnosis is drastically improved. It may be possible to diagnose failures to the failed integrated circuit in the field; this would eliminate expensive inventories associated with board-replacement field maintenance strategies.

Finally, this concept can also be combined with existing methodologies to produce self-testing and fault-secure designs where the hardware test and response capabilities are included in the system design itself.

The above description is exemplary rather than limiting and other embodiments and equivalents of the present invention, as defined by the claims, may now be apparent to a person skilled in the art. Accordingly, the claims should be interpreted as covering all embodiments and equivalents which fall within the spirit and scope of the invention.

I claim:

1. A logic element for constructing logic circuits which allows the structural testing of such circuits with a minimal number of test patterns, comprising:

(a) a power input terminal for directing external power to the logic element;
(b) a ground terminal;
(c) gating means coupled between the power input terminal and ground terminal, wherein the gating means has:
  (1) first bidirectional switch means;
  (2) second bidirectional switch means;
  (3) first data input means for applying data signals to the first bidirectional switch means;
  (4) second data input means for applying data signals to the second bidirectional switch means;
  (5) data output means for sensing signals generated by the gating means;
  (6) wherein the first and second bidirectional switch means are configured so that the gating means is capable of generating a functionally complete logic function signal at the data output means in response to the signals applied to the first and second switch means through the first and second data input means;
(d) bidirectional mode switch means coupled between the data input means;
(e) a single mode input means for applying a mode signal to the mode switch means;
(f) wherein the element functions as an AND gate or OR gate in test modes, in response to signals applied to the mode input means, when current normally applied across the power and ground terminals is reversed, whereby all data input or data output stuck-at faults can be detected with only two data signal test patterns.

2. The logic element of claim 1, wherein:
(a) the gating means is capable of functioning as a NAND gate; and
(b) in the first test mode, the logic element functions as an AND gate when the current normally applied across the power input terminal and ground terminal is reversed, whereby the output terminal of the logic element indicates a data input or output stuck-at zero fault or a switch means stuck-at open fault when a logic zero is sensed at the output means in response to applying a logic one signal to the data input means.

3. The logic element of claim 2, wherein: in the second test mode, the test element functions as an OR gate when a signal is applied through the mode input means to the mode switch means to effectively short the data input terminals while the current normally applied across the power input terminal and ground terminal is reversed, whereby the logic element indicates a data input or data output stuck-at one fault when a logic one signal is sensed at the output means in response to applying a logic zero signal at the input data means.

4. The logic element of claim 3, wherein:
(a) the gating means further comprises resistance means coupled between the power input terminal and the first and second switch means; and
(b) the first and second bidirectional switch means are coupled in a series configuration between the resistance means and the ground terminal wherein the first switch means closes in response to a signal coupled through the first data input means and the second switch means closes in response to a signal coupled through the second data input means.

5. The logic element of claim 4, wherein the gating means further comprises:

(a) first redundant switch means coupled in a parallel configuration with the first switch means between the resistance means and the second switch means;
(b) second redundant switch means coupled in a parallel configuration with the second switch means between the first switch means and the ground terminal;
(c) first test input means coupled to the first redundant switch means wherein the first redundant switch means closes in response to a signal applied through the first test input means; and
(d) second test input means coupled to the second redundant switch means wherein the second redundant switch means closes in response to a signal applied through the second test input means, whereby the element indicates a first switch means stuck-at closed when a logic one signal is sensed at the output means in response to logic one signals being applied to mode input means and the first test input means and a logic zero signal being applied to the second test input means and to all data input means, and whereby the element indicates a second switch means stuck-at closed when a logic one signal is sensed at the output means in response to logic one signals being applied to mode input means and the second test input means and a logic zero is being applied to the first input means and to all data input means.

6. The logic element of claim 1, wherein:
(a) the gating means is capable of functioning as a NOR gate; and
(b) in the first test mode, the logic element functions as an OR gate when the current normally applied across the power input terminal and ground terminal is reversed whereby the output terminal of the logic element indicates a data input or data output stuck-at one fault when a logic one signal is sensed at the output means in response to applying a logic zero signal at the input data means.

7. The logic element of claim 6, wherein: in the second test mode, the test element functions as an AND gate when a signal is applied through the mode input means to the mode switch means to effectively short the data input terminals while the current normally applied across the power input terminal and ground terminal is reversed whereby the logic element indicates a data input or output stuck-at zero fault or a switch means stuck-at open fault when a logic zero is sensed at the output means in response to applying a logic one signal to the data input means.

8. The logic element of claim 7, wherein:
(a) the gating means further comprises resistance means coupled between the power input terminal and the first and second switch means; and
(b) the first and second bidirectional switch means are coupled in a parallel configuration between the resistance means and the ground terminal wherein the first switch means closes in response to a signal coupled to the first data input terminal, and the second switch means closes in response to a signal coupled to the second data input terminal.

9. The logic element of claim 8, wherein the gating means further comprises:
(a) first redundant switch means coupled in series with the first switch means between the resistance means and the ground terminal;

(b) second redundant switch means coupled in series with the second switch means between the resistance means and ground terminal;

(c) first test input means coupled to the first redundant switch means wherein the first redundant switch means closes in response to a signal applied through the first test input means; and (d) second test input means coupled to the second redundant switch means wherein the second redundant switch means closes in response to a signal applied through the first test input terminal whereby the application of logic signals to the redundant switch means through the test input means permits the testing for first and second switch means stuck-at closed fault.

10. The logic element of claims 8, wherein the element further comprises: coupling means for coupling data signals between the gating means and the data output means wherein the coupling means functions as a buffer in the normal mode and as an inverter in the test modes.

11. The logic element as in one of claims 1–10, wherein: the logic element is a NMOS fabricated element.

12. A logic element for constructing logic circuits which allows the structural testing of such circuits with a minimal number of test patterns, comprising:
(a) a power input terminal and a ground terminal for applying external power to the logic element;
(b) gating means coupled between the power input and ground terminals which is capable of functioning as a NAND gate, wherein said gating means has:
  (1) at least first and second bidirectional switch means;
  (2) at least first and second data input terminals electrically coupled to the first and second switch means, respectively, for applying data signals to the first and second switch means; and
  (3) data output terminal electrically coupled to the switch means for sensing the logic function signal generated by the gating means in response to signals applied to the first and signal switch means;
(c) bidirectional mode switch means coupled between the data input terminals, the mode switch means having a single mode input terminal for applying an external test mode signal to the mode switch means; and
(d) wherein the test element functions as an AND gate when the external current normally applied across the power input and ground terminals is reversed and a logic zero signal is applied to the mode input terminal, whereby the output terminal of the element indicates a data input or output stuck-at zero fault or a data switch stuck at open fault when a logic zero signal is sensed at the output terminal in response to applying a logic one signal to the data input terminals.

13. The logic element of 12, wherein: the test element functions as an OR gate when a logic one signal is applied through the mode input terminal to the mode switch means to effectively short the data input terminals while the voltage normally applied across the power input terminal and ground terminal is reversed whereby the output terminal of the logic element indicates a data input or data output stuck-at one fault when a logic one signal is generated at the output terminal in response to applying a logic zero signal to the input data terminals.

14. A logic element for constructing logic circuits which allows the structural testing of such circuits with a minimal number of test patterns, comprising:
(a) a power input terminal and a ground terminal for applying external power to the logic element;
(b) gating means coupled between the power input and ground terminals which is capable of functioning as a NOR gate, wherein said gating means has:
  (1) at least first and second bidirectional switch means;
  (2) at least first and second data input terminals electrically coupled to the first and second switch means, respectively, for applying data signals to the first and second switch means; and
  (3) data output terminal electrically coupled to the switch means for sensing the logic function signal generated by the gating means in response to signals applied to the first and signal switch means;
(c) bidirectional mode switch means coupled between the data input terminals, the mode switch means having a single mode input terminal for applying an external test mode signal to the mode switch means; and
(d) wherein the test element functions as an OR gate when the external current normally applied across the power input and ground terminal is reversed and logic zero signal is applied to the mode input terminal whereby the output terminal of the element indicates a data input or data output stuck-at one fault when a logic one is generated at the output terminal in response to applying a logic zero signal to the data input terminals.

15. The logic element of claim 14, wherein: the logic element functions as an AND gate when a logic one signal is applied through the mode input terminal to the mode switch means to effectively short the data input terminals while the current normally applied across the power input terminal and ground terminal is reversed whereby the output terminal of the logic element indicates a data input or output stuck-at zero fault or a data switch stuck at one fault when a logic one signal is generated at the output terminal in response to applying a logic one data signal to the input terminals.

16. A sequential logic circuit which allows the structural testing of such circuit with a minimal number of test patterns, comprising:
(a) At least first and second logic elements, wherein each logic element comprises:
  (1) a power input terminal for directing external power to the logic element;
  (2) a ground terminal;
  (3) gating means coupled between the power input terminal and ground terminal, wherein the gating means has:
    (i) first bidirectional switch means;
    (ii) second bidirectional switch means;
    (iii) first data input means for applying data signals to the first bidirectional switch means;
    (iv) second data input means for applying data signals to the second bidirectional switch means;
    (v) data output means for sensing signals generated by the gating means;
    (vi) the first and second bidirectional switch means are configured so that the gating means is capable of generating a functionally complete logic function signal at the data output means in response to the signals applied to the first and second switch means through the first and second data input means;

(4) bidirectional mode switch means coupled between the data input means;

(5) a signal mode input means for applying a mode signal to the mode switch means;

(6) wherein each element functions as an AND gate or OR gate in test modes, when current normally applied across the power and ground terminal is reversed, in response to signals applied to the mode input means;

(b) single circuit mode input means electrically coupled to the mode input means of each of the plurality of logic elements; and (c) wherein a data input means of the first element is coupled to the data output means of the second element.

17. The sequential logic circuit of claim 16 wherein: a data input means of the second element is coupled to the data output means of the first element, whereby the elements are cross-coupled.

18. The sequential logic circuit of claim 17, wherein: the cross-coupled logic elements function in normal mode as an S-R latch.

19. The sequential logic circuit of claim 16, wherein:

(a) the gating means of each of the plurality of elements is capable of functioning as a NAND gate; and (b) in the first test mode, each of the plurality of logic elements functions as an AND gate when the current normally applied across the power input terminal and ground terminal is reversed, whereby the output terminal of the first logic element indicates a data input or output stuck-at zero fault or a switch means stuck-at open fault when a logic zero is sensed at the output means in response to applying a logic one signal to the data input means of each of the plurality of logic elements not connected to the output means of another logic element.

20. The sequential logic circuit of claim 19, wherein: in the second test mode, each of the plurality of logic elements functions as an OR gate when a signal is applied through the mode input means to the mode switch means to effectively short the data input terminals while the current normally applied across the power input terminal and ground terminal is reversed, whereby the first logic element indicates a data input or data output stuck-at one fault when a logic one signal is sensed at the output means in response to applying a logic zero signal at the input data means of each of the plurality of logic elements not connected to the output means of another logic element.

21. The sequential logic circuit of claim 16, wherein:

(a) the gating means is capable of functioning as a NOR gate; and (b) in the first test mode, the logic element functions as an OR gate when the current normally applied across the power input terminal and ground terminal is reversed whereby the output terminal of the first logic element indicates a data input or data output stuck-at one fault when a logic one signal is sensed at the output means in response to applying a logic zero signal at the input data means of each of the plurality of logic elements not connected to the output means of another logic element.

22. The sequential logic circuit of claim 21, wherein: in the second test mode, the test element functions as an AND gate when a signal is applied through the mode input means to the mode switch means to effectively short the data input terminals while the current normally applied across the power input terminal and ground terminal is reversed whereby the first logic element indicates a data input or output stuck-at zero fault or a switch means stuck-at open fault when a logic zero is sensed at the output means in response to applying a logic one signal to the data input means of each of the plurality of logic elements not connected to the output means of another logic element.

23. The sequential logic circuit as in one of claims 16–22, wherein: the logic circuit is an NMOS fabricated circuit.

24. A method for the structural testing of a logic circuit with a minimal number of test patterns, said circuit having a plurality of circuit data input terminals, at least one circuit output terminal, a circuit power terminal, a circuit ground terminal, a single circuit mode input terminal and a plurality of logic elements functionally connected to form said logic circuit, wherein each of said logic elements is capable of generating a functionally complete logic function in its normal mode of operation and operates as an AND gate in a first test mode and an OR gate in a second test mode in response to a logic signal applied through said single circuit mode input terminal, comprising:

(a) electrically converting each of said plurality of logic elements into an AND logic gate;

(b) applying logic one signals to the circuit data input terminals;

(c) sensing the logic signal generated at the circuit output terminal whereby the sensing of a logic zero signal indicates a data input or output stuck-at zero fault or a data switch stuck-at open fault;

(d) electrically converting each of said plurality of logic elements into an OR logic gate;

(e) applying logic zero signals to the circuit data input terminals;

(f) sensing the logic signal generated at the circuit output terminal whereby the sensing of a logic one signal indicates a data input or data output stuck-at one fault whereby the element can be tested for all data input and output stuck-at faults with two data signal test patterns.

25. The method of claim 24, wherein:

(a) each of said plurality of logic element comprises:

(1) a power input terminal electrically connected to the circuit power terminal;

(2) a ground terminal electrically connected to the circuit ground terminal;

(3) gating means coupled between the power and ground terminals which is capable of functioning as a NAND gate, said gate having at least two data input terminals and a data output terminal; and (4) a mode switch having a single mode input terminal coupled between the data input terminals of the gating means;

(b) said single circuit mode terminal is electrically connected to the mode input terminal of each of said plurality of logic elements; and (c) the step of electrically converting an element into an AND gate comprises reversing the current normally applied across the circuit power terminal and circuit ground terminal and applying a signal to the single circuit mode input terminal so that the mode switch is open.

26. The method of claim 25, wherein the step of electrically converting each of the plurality of elements into an OR gate comprises: applying a signal to the circuit mode terminal to close the mode switch of each of said plurality of logic elements.

27. The method of claim 26, wherein:
(a) each of said plurality of logic elements comprises:
  (1) a power input terminal electrically connected to the circuit power terminal;
  (2) a ground terminal electrically connected to the circuit ground terminal;
  (3) a gate coupled between the circuit power and ground terminals which is capable of functioning as a NOR gate, said gate having at least two data input terminals and a data output terminal; and
  (4) a mode switch having a single mode input terminal coupled between the gate data input terminals;
(b) said single circuit mode terminal is electrically connected to the mode input terminal of each of said plurality of logic elements; and
(c) the step of electrically converting each of the plurality of elements into an OR gate comprises: reversing the current normally applied across the power supply terminal and circuit ground terminal and applying a signal to the single mode input terminal so that the mode switch is open.

28. The method of claim 27, wherein the step of electrically converting each of the plurality of elements into an AND gate comprises: applying a signal to the single circuit mode terminal to close the mode switch of each of said plurality of logic elements.

29. A method of structural testing of a sequential logic circuit with a minimal number of test patterns, said circuit having a single circuit mode terminal and at least first and second cross-coupled logic elements, wherein each of said plurality of elements is capable of generating a functionally complete logic function and has a power input terminal and a ground terminal for applying external power to the logic element, a first data input terminal for applying external data signals to said element, a second data input terminal, a data output terminal coupled to said second data input terminal of the other element forming the plurality of cross-coupled elements, a mode switch coupled between the first and second data input terminals, and a single mode input terminal for coupling signals between said circuit mode terminal and the mode switch:
(a) electrically converting each of the plurality of logic elements into an OR gate;
(b) applying logic one signals to the first data input terminals to initialize the state information in the sequential circuit to logic one;
(c) electrically converting each of the plurality of logic elements directly from an OR gate into an AND gate;
(d) sensing the logic signal generated at the output terminal of one of said plurality of elements whereby the sensing of a logic zero signal indicates a data input or output stuck-at zero fault or a data switch stuck-at open fault;
(e) applying logic zero signals to the first data input terminals of the cross-coupled elements to initialize the state information in the sequential circuit to logic zero;
(f) electrically converting each of the plurality of elements directly from an AND gate into an OR gate; and
(g) sensing the logic signal generated at the output terminal of one of said plurality of elements whereby the sensing of a logic one signal indicates a data input or data output stuck-at one fault.

30. The method of claim 29, wherein:
(a) each of the plurality of logic elements is capable of functioning as an NAND gate;
(b) the step of electrically converting each of the plurality of elements into an AND gate comprises: reversing the current normally applied across the power input terminal and ground terminal.

31. The method of claim 30, wherein the step of electrically converting each of the plurality of elements into an OR gate comprises: applying a signal to the circuit mode input terminal to close the plurality of mode switches.

32. The method of claim 29, wherein:
(a) each of the plurality of elements is capable of functioning as a NOR gate;
(b) the step of electrically converting each of the plurality of elements into an OR gate comprises: reversing the current normally applied to the power supply terminal and circuit ground terminal.

33. The method of claim 32, wherein the step of electrically converting each of the plurality of elements into an AND gate comprises: applying a signal to the circuit mode input terminal to close the plurality of mode switches.

* * * * *